US008489363B2

(12) United States Patent
Piccirillo et al.

(10) Patent No.: US 8,489,363 B2
(45) Date of Patent: Jul. 16, 2013

(54) MONITORING AND DIAGNOSING GENERATOR OPERATION

(75) Inventors: Nicola Piccirillo, Scotia, NY (US); Narayanan Urupuniakavu Madam, Bangalore (IN); Sudhanshu Rai, Bangalore (IN); Ganesh Kumar Chandira Ramappa, Bangalore (IN)

(73) Assignee: General Electric Company, Schenectady, NY (US)

( * ) Notice: Subject to any disclaimer, the term of this patent is extended or adjusted under 35 U.S.C. 154(b) by 357 days.

(21) Appl. No.: 12/892,211

(22) Filed: Sep. 28, 2010

(65) Prior Publication Data

US 2012/0078578 A1  Mar. 29, 2012

(51) Int. Cl.
*G06F 19/00* (2011.01)

(52) U.S. Cl.
USPC .......................................................... 702/185

(58) Field of Classification Search
USPC .................................. 702/185, 182–184, 188
See application file for complete search history.

(56) References Cited

U.S. PATENT DOCUMENTS

| 2002/0052712 A1 | 5/2002 | Voser et al. |
| 2003/0105613 A1 | 6/2003 | Nagafuchi et al. |
| 2005/0188745 A1* | 9/2005 | Staphanos et al. ........... 73/23.31 |
| 2009/0100293 A1 | 4/2009 | LaComb et al. |

FOREIGN PATENT DOCUMENTS

| EP | 2026160 A1 | 2/2009 |
| WO | 2005/038545 A1 | 4/2005 |
| WO | 2008/127535 A1 | 10/2008 |

OTHER PUBLICATIONS

Great Britain Search Report issued in connection to GB Patent Application No. 1116031.4, Jan. 18, 2012.

* cited by examiner

*Primary Examiner* — Edward Raymond
(74) *Attorney, Agent, or Firm* — Hoffman Warnick LLC; Ernest G. Cusick

(57) ABSTRACT

A tool for evaluating operation of a generator is provided. Diagnostic data is obtaining from a sensor in a generator. An associated computer system evaluates the diagnostic data to determine whether an anomaly exists in the data. If an anomaly exists, the computer system can provide a fault code that indicates a nature of an error in the generator that caused the anomaly.

15 Claims, 4 Drawing Sheets

System User Configurable Parameters

| Tag Name | Description | Value | Low Limit | High Limit | Unit |
|---|---|---|---|---|---|
| INPUT_MVA_RATING | Rated MVA | 742 | 0 | 0 | MVA |
| INPUT_KV_RATING | Rated kV | 24 | 0 | 0 | kV |
| INPUT_PFRAT | Rated PF | 0.9 | 0.8 | 0.95 | |
| INPUT_GEN_AMP_RATING | Rated Current | 17855 | 0 | 0 | A |
| INPUT_NCIRC | Number of Circuits | 2 | 1 | 4 | |
| INPUT_WINDING_TYPE | Liquid cooled stator winding diagram ref | 7 | 1 | 12 | |
| INPUT_SCWFLOW | Stator Cooling Water Flow Type | 0 | 0 | 1 | |
| INPUT_BHLR | Baseline H2 leak rate | 2 | 0 | 10 | |
| INPUT_CGRATE | Rated Cold Gas Temp | 32 | 30 | 46 | |
| INPUT_BDWQ | Baseline of SCW flow rate | 0 | 1 | 12 | |
| INPUT_BDWPH | Baseline of SCW pressure | 0 | 1 | 12 | |

FIG. 4

MONITORING AND DIAGNOSING GENERATOR OPERATION

BACKGROUND ART

The disclosure relates generally to generator technology, and more particularly, to tools for monitoring and diagnosing generator operation.

Generators in power generation applications convert mechanical energy to electricity. This mechanical energy can take many forms, including: internal combustion, steam or steam turbine, hydro, wind, compressed air, animal powered, etc. Many modern generators are complicated machines that convert large amounts of energy to supply electrical power to an electrical grid from which homes and businesses receive their electricity.

One challenge has been the way in which these generators are maintained. As with all machines, generators may become worn over time. Further, due to the complexity of modern generators, problems, which may initially be small, may be hidden. These hidden problems, if not corrected, may escalate, causing ever larger problems, eventually leading to forced outages.

To date, maintenance of generators has been accomplished by way of routine scheduled maintenance. This entails sending a technician to the site of the generator at predetermined intervals.

However, the scheduled (or preventative) maintenance approach to maintaining generators may not be optimal in terms of cost. A problem that goes undetected may have escalated or already caused down time, or, if the generator is healthy, the scheduled maintenance may be unnecessary.

BRIEF DESCRIPTION OF THE INVENTION

Aspects of the invention provide a tool for evaluating operation of a generator. Diagnostic data is obtaining from a sensor in a generator. An associated computer system evaluates the diagnostic data to determine whether an anomaly exists in the data. If an anomaly exists, the computer system can provide a fault code that indicates a nature of an error in the generator that caused the anomaly.

A first aspect of the invention provides a computer-implemented method of evaluating generator operation, the method comprising: obtaining diagnostic data from a first sensor in a generator, the diagnostic data including a series of data values observed by the first sensor over time; evaluating, by a computer system, the diagnostic data to determine whether an anomaly exists in the data as the diagnostic data is obtained; and based on a determination that the anomaly exists, providing, by the computer system, a fault code that indicates a nature of an error in the generator that caused the anomaly.

A second aspect of the invention provides a computer system for evaluating generator operation, the computer system comprising: a component configured to obtain diagnostic data from a first sensor in a generator, the diagnostic data including a series of data values observed by the first sensor over time; a component configured to evaluate the diagnostic data to determine whether an anomaly exists in the data as the diagnostic data is obtained; a component configured to provide by the computer system, based on a determination that the anomaly exists, a fault code that indicates a nature of an error in the generator that caused the anomaly.

A third aspect of the invention provides a computer program comprising program code embodied in at least one computer-readable medium, which when executed, enables a computer system to implement a method of evaluating generator operation, the method comprising: obtaining diagnostic data from a first sensor in a generator, the diagnostic data including a series of data values observed by the first sensor over time; evaluating the diagnostic data to determine whether an anomaly exists in the data as the diagnostic data is obtained; and based on a determination that the anomaly exists, providing, by the computer system, a fault code that indicates a nature of an error in the generator that caused the anomaly.

A fourth aspect of the invention provides a method of generating a computer system for evaluating generator operation, the method comprising: providing a computer system operable to: obtain diagnostic data from a first sensor in a generator, the diagnostic data including a series of data values observed by the first sensor over time; evaluate the diagnostic data to determine whether an anomaly exists in the data as the diagnostic data is obtained; and based on a determination that the anomaly exists, provide, by the computer system, a fault code that indicates a nature of an error in the generator that caused the anomaly.

A fifth aspect of the invention provides a method comprising: at least one of providing or receiving a copy of a computer program that is encoded in a set of data signals, wherein the computer program enables a computer system to implement a method of evaluating generator operation, the method comprising: obtaining diagnostic data from a first sensor in a generator, the diagnostic data including a series of data values observed by the first sensor over time; evaluating the diagnostic data to determine whether an anomaly exists in the data as the diagnostic data is obtained; and based on a determination that the anomaly exists, providing, by the computer system, a fault code that indicates a nature of an error in the generator that caused the anomaly.

Other aspects of the invention provide methods, systems, program products, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 4 shows an example of a user interface, used to allow a user to enter and/or adjust parameters according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a tool for evaluating operation of a generator. Diagnostic data is obtaining from a sensor in a generator. An associated computer system evaluates the diagnostic data to determine whether an anomaly exists in the data. If an anomaly exists, the computer system can provide a fault code that indicates a nature of an error in the generator that caused the anomaly.

Figure 1:
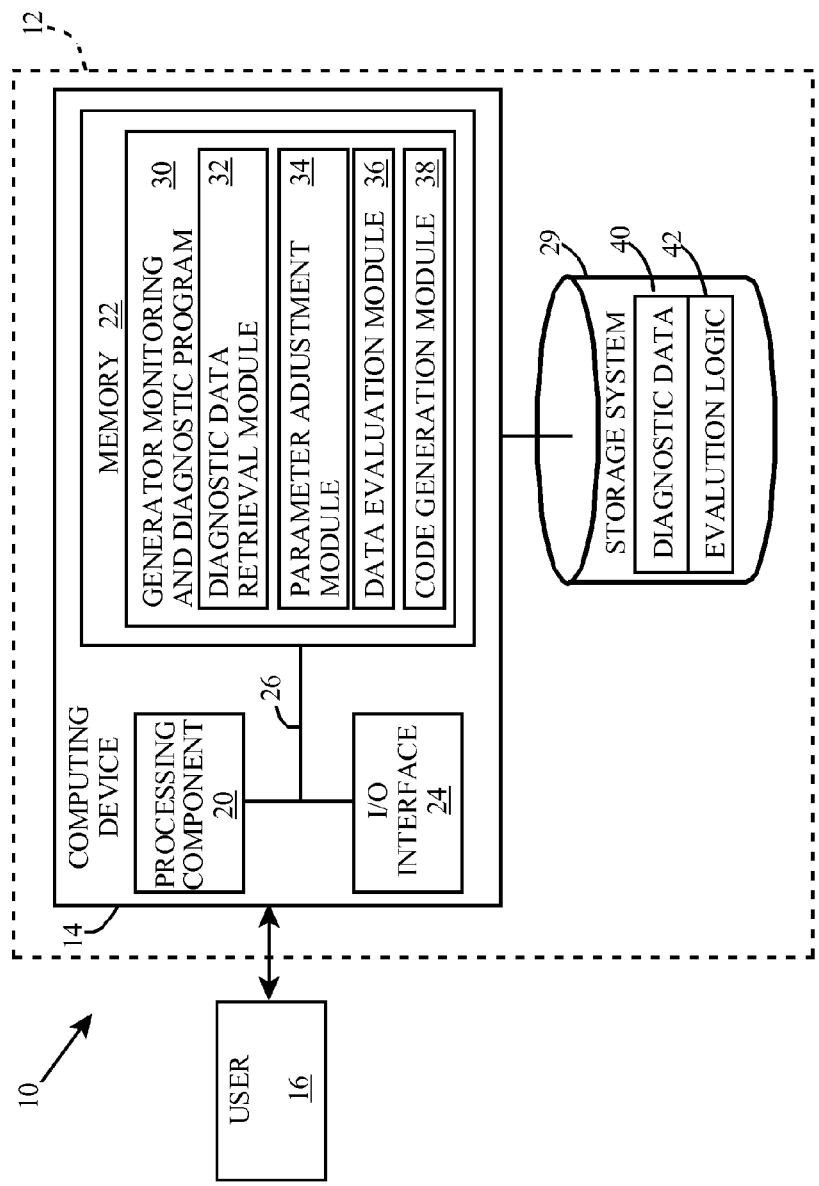
FIG. 1 shows an illustrative environment for monitoring and diagnosing the operation of a generator according to an embodiment.

Turning to the drawings, FIG. 1 shows an illustrative environment 10 for monitoring and diagnosing the operation of a generator according to an embodiment. To this extent, environment 10 includes a computer system 12 that can perform a process described herein in order to monitor and diagnose the operation of a generator. In particular, computer system 12 is shown including a computing device 14 that includes a generator monitoring and diagnostic program 30, which makes computing device 14 operable to monitor and diagnose the operation of a generator by performing a process described herein.

Computing device 14 is shown including a processing component 20 (e.g., one or more processors), a memory 22, a storage system 29 (e.g., a storage hierarchy), an input/output (I/O) interface component 24 (e.g., one or more I/O interfaces and/or devices), and a communications pathway 26. In general, processing component 20 executes program code, such as generator monitoring and diagnostic program 30, which is at least partially fixed in memory 22. While executing program code, processing component 20 can process data, which can result in reading and/or writing transformed data from/to memory 22 and/or I/O component 24 for further processing. Pathway 26 provides a communications link between each of the components in computer system 12. I/O interface component 24 can comprise one or more human I/O devices, which enable a human user 16 to interact with computer system 12 and/or one or more communications devices to enable a system user 16 to communicate with computer system 12 using any type of communications link. To this extent, generator monitoring and diagnostic program 30 can manage a set of interfaces (e.g., graphical user interface(s), application program interface, and/or the like) that enable human and/or system users 16 to interact with generator monitoring and diagnostic program 30. Further, generator monitoring and diagnostic program 30 can manage (e.g., store, retrieve, create, manipulate, organize, present, etc.) the data, such as diagnostic data 40 and/or evaluation logic 42, using any solution.

In any event, computer system 12 can comprise one or more general purpose computing articles of manufacture 14 (e.g., computing devices) capable of executing program code, such as generator monitoring and diagnostic program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, generator monitoring and diagnostic program 30 can be embodied as any combination of system software and/or application software. In any event, the technical effect of computer system 12 is to provide processing instructions to computing device 14 in order to monitor and diagnose operation of a generator.

Further, generator monitoring and diagnostic program 30 can be implemented using a set of modules 32-38. In this case, a module 32-38 can enable computer system 12 to perform a set of tasks used by generator monitoring and diagnostic program 30, and can be separately developed and/or implemented apart from other portions of generator monitoring and diagnostic program 30. As used herein, the term "component" means any configuration of hardware, with or without software, which implements the functionality described in conjunction therewith using any solution, while the term "module" means program code that enables a computer system 12 to implement the actions described in conjunction therewith using any solution. When fixed in a memory 22 of a computer system 20 that includes a processing component 20, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 12.

When computer system 12 comprises multiple computing devices 14, each computing device can have only a portion of generator monitoring and diagnostic program 30 fixed thereon (e.g., one or more modules 32-38). However, it is understood that computer system 12 and generator monitoring and diagnostic program 30 are only representative of various possible equivalent computer systems that may perform a process described herein. To this extent, in other embodiments, the functionality provided by computer system 12 and generator monitoring and diagnostic program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 12 includes multiple computing devices 14, the computing devices can communicate over any type of communications link. Further, while performing a process described herein, computer system 12 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, generator monitoring and diagnostic program 30 enables computer system 20 to monitor and diagnose the operation of a generator. To this extent, generator monitoring and diagnostic program 30 is shown including a diagnostic data retrieval module 32, a parameter adjustment module 34, a data evaluation module 36, and a code generation module 38.

Figure 2:
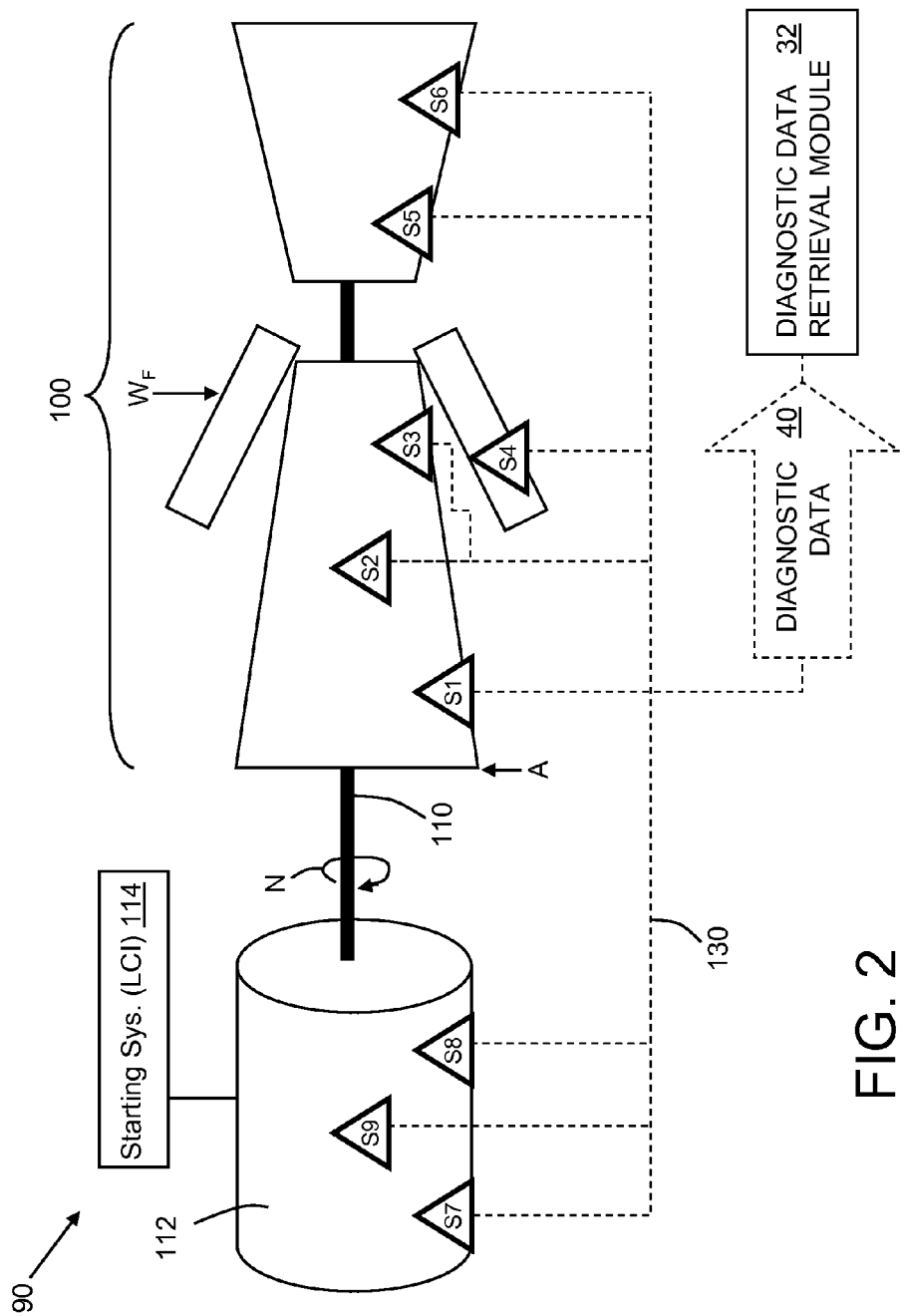
FIG. 2 shows an example of a power plant type generator, which includes a gas turbine, according to an embodiment.

Referring now to FIG. 2, one example of a power plant type generator 90, which includes a gas turbine 100 according to an embodiment is shown. As illustrated, gas turbine 100 can include any now known or later developed gas turbine. Gas turbine 100 turns a rotor 110 by burning a fuel such as natural gas. Rotor 110 is coupled to a generator 112 that generates electric power from the turning of rotor 110. Generator 112 can include any now known or later developed generator that includes a starting system 114 such as a motor, a load commutating inverter (LCI) or similar structure for applying an external torque to rotor 110. As understood, starting system 114 is functionally coupled to rotor 110 and configured to reverse the operation of generator 112 for powered turning of rotor 100. If an LCI 114 is used, in simplified terms, it turns generator 112 into a motor. While shown herein as a gas turbine type generator, it is understood that the generator that is monitored and diagnosed could include any means now known or later conceived for electric generation.

In any case, computer system 12 (e.g., diagnostic data retrieval module 32) obtains diagnostic data 40 from one or more sensors (FIG. 2, S1-S9), in a generator, such as power plant 90. To this end, sensors S1-S9 can be embedded within the generator, can be permanently or temporarily connected to the generator, and/or can operatively associated with the generator in any way now known or later developed for sensing diagnostic data 40 from a generator. As shown in FIG. 2, sensors S1-S9 can be distributed throughout power plant 90 to monitor and transmit diagnostic data 40 from various parts of power plant 90. For example, sensor S2 can be located in a portion of power plant 90 containing gases that are contained under pressure therein, while sensor S1 can be located in a portion of power plant 90 through which liquids are expected to flow. Further, different ones of sensors S1-S9 may regulate different classes of conditions within power plant 90, including, but not limited to temperature, pressure, density, viscosity, flow, etc. For example, sensor S1 can monitor and transmit diagnostic data 40 reflecting the temperature in its location, while sensor S2 can monitor and transmit diagnostic data 40 reflecting the pressure in its location.

As sensors S1-S9 collect diagnostic data 40, sensors S1-S9 transmit diagnostic data 40 to computer system 12 (e.g., diagnostic data retrieval module 32). Computer system 12 may be co-located with the generator, such as in a common room, building, physical site, etc. Similarly, computer system 12 can be associated with the generator via a computer network that is internal to an operator of the generator, which can be a private network that is separated from other networks by one or more firewalls. Alternatively, computer system 12 can be remotely located from the generator.

In any case, this collection and transmitting of diagnostic data 40 can occur as a constant stream (e.g., transmitted in real time as the information is collected by the sensor), or, in the alternative, can occur periodically, at scheduled intervals, such as hourly. In any case, diagnostic data 40 is obtained by computer system 12 via a diagnostic data conduit 130. Diagnostic data conduit 130 can be any solution for conveying data, such as diagnostic data 40, from one location to another that is now known or later developed, including, but not limited to wired or wireless embodiments. As computer system 12 retrieves diagnostic data 40, computer system 12 can accumulate and store diagnostic data 40 for later analysis, such as in storage system 29. In the alternative, diagnostic data 40 could be collected by a separate data historian (not shown), which acts as a log of previously collected diagnostic data 40 that may be used to, inter alia, find historical trends. To this extent, the data historian could include a Pi-server, available from OSIsoft, eDNA, available from Instep, or any other embodiment of energy data management or generic data aggregation tool now known or later developed in the art.

Figure 3:
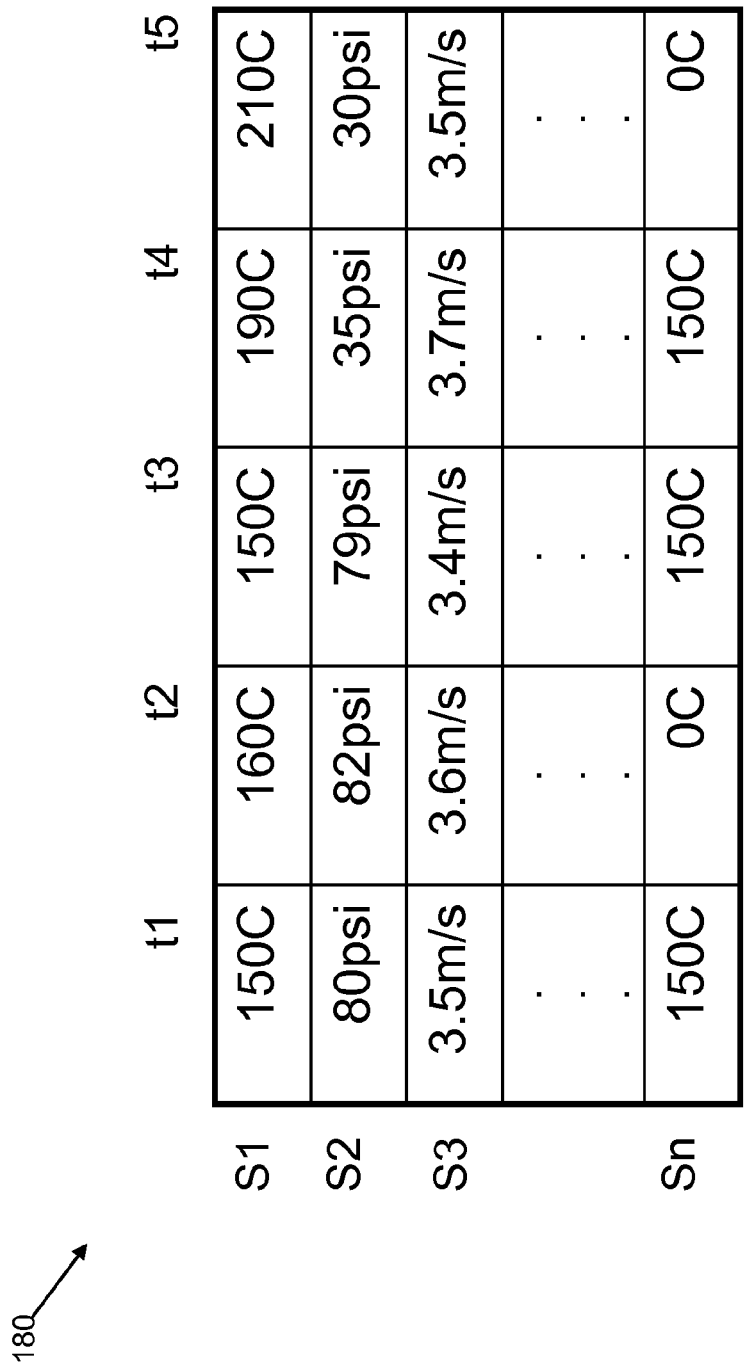
FIG. 3 shows an example of diagnostic data retrieved according to an embodiment.

FIG. 3 shows an example of diagnostic data 40 retrieved by computer system 12 (FIG. 1). A log table 180 shows a sample of possible diagnostic data 40 over a number of time intervals t1-t5. As illustrated, diagnostic data 40 has been obtained from sensors S1 and Sn in the form of temperature data, measured in Celsius. In contrast, diagnostic data 40 for sensor S2 is pressure data, measured in pounds per square inch, and diagnostic data 40 for sensor S3 is flow rate data, measured in meters per second.

Referring again to FIG. 1, as the data is being obtained by computer system 12 and/or retrieved from the data historian, computer system 12 (e.g., data evaluation module 36) can evaluate diagnostic data 40 to determine whether an anomaly exists in diagnostic data 40. This evaluation by computer system 12 can be done on site by a computer system that is associated with the generator, such as that of the user of the generator. This on site evaluation and subsequent reporting can allow the user to be in constant awareness of the status of the generator and to know in a timely manner when any problems arise.

In making these evaluations, data evaluation module 36 of computer system 12 can use evaluation logic 42, which can be stored in storage system 29. Evaluation logic 42 provides a knowledge base of embedded diagnostic intelligence that is specific to the type of generator and/or the individual generator that is being monitored. To this extent, evaluation logic 42 provides rules and/or parameters that enable evaluation module 36 to make determinations that are specific, not only to the type (e.g., make, model, family) of generator, but also to the individual generator itself. To this extent, evaluation logic 42 can include knowledge base information for the particular type of generator that is based on the original operator specification for the generator type. Further, evaluation logic 42 can include knowledge base information obtained over time by technicians who have been servicing generators of this type. In addition, evaluation logic 42 can also include parameters, such as tolerances, deviations or allowable fault occurrences, that are specific to the individual generator.

FIG. 4, shows an example of a user interface 200, which can be used by computer system 12 (e.g., parameter adjustment module 34) to allow a user 16 to enter and/or adjust parameters that are specific to the individual generator that is being monitored and evaluated. These parameters can be entered by user 16 via user interface 200 and incorporated into evaluation logic 42 by computer system 12. As such, parameter adjustment module 34 can be used by user 16 to change default values for the parameters that set at the manufacturer based on general fleet experience to sensitize or desensitize the diagnostics based on user's 16 experience of the particular generator. For example, the parameters can be customized by user 16 to account for random noises in the data, aging, variability, etc. Using parameter adjustment module 34, user 16 can adjust parameters for particular data values such as those included in user interface 200, including, but not limited to maximum tolerance, minimum tolerance, maximum deviation, number of anomalous occurrences until an error is generated, etc.

In any case, data evaluation module 36 of computer system 12 may use evaluation logic 42 to evaluate diagnostic data 40 from a single sensor S1-Sn. Referring again to FIG. 3, computer system 12 can evaluate diagnostic data 40 from each of the sensors S1-Sn to determine whether an anomaly exists in the diagnostic data 40. Such an anomaly would indicate that a value or set of values from one or a combination of sensors S1-Sn is outside of the expected values provided by evaluation logic 42 (as adjusted by user 16, if applicable).

For example, if the parameters in evaluation logic 42 dictate two or more anomalous occurrences, computer system 12 may determine that diagnostic data 40 from sensor Sn that shows 0° C. readings at times t2 and t5 constitute an anomaly. Further, computer system 12 may determine that diagnostic data 40 from sensor S3 that shows 3.7 m/s readings at time t4 does not constitute an anomaly if the parameters in evaluation logic 42 dictate a maximum flow of 4 m/s or a maximum flow of 3.6 m/s and a minimum number of occurrences of 2.

In the alternative, data evaluation module 36 of computer system 12 can use evaluation logic 42 to evaluate diagnostic data 40 from a plurality of sensors S1-Sn in conjunction with one another to determine whether an anomaly exists and pinpoint the portion of the generator responsible for the anomalous readings. For example, computer system 12 may determine that diagnostic data 40 from sensor S1 that shows temperature readings climbing and pressure readings from sensor S2 simultaneously dropping at t4 and t5 constitute an anomaly.

When a determination is made by data evaluation module 36 that an anomaly has occurred, code generation module 38 can use evaluation logic 42 to generate a fault code that indicates the nature of the error in the generator that caused the detected anomaly. This fault code includes a unique indicator provided to user 16 of computer system 12, which indicates the source or sources within the generator (e.g., the specific component or components of the generator) that are causing the condition from which the anomalous diagnostic data 40 has arisen. To this extent, the fault code may be a code, such as a numeric or alphanumeric code, which may be read by user 16. Further, the fault code may include a more detailed description of the error, such as a word, phrase, sentence or paragraph describing the error. Additionally, or in the alternative, the fault code may be used by user 16 to look up more detailed information regarding the error, such as via user interface 200. To this extent, the fault codes may indicate errors that include, but are not limited to: failures of stator armature bars for obstructions in the coolant path, leaks, and insulation damage; failures in the stator cooling water system for obstructions in the coolant path; failures in the rotor field for shorted turns or thermal sensitivity; stator end winding or stator wedge looseness; bearing metal damage; wiring damage causing a short; H2 seal damage; or leakage or unintended mixing of fluids. These fault codes can be generated on site and can be displayed on an on site console, forwarded as a message to user 16 of the generator, and/or forwarded as a message to a remote location, such as to an appropriate technician.

For example, referring to the above examples described based on FIG. 3, a determination of an anomaly with respect to sensor Sn can precipitate generation of a fault code by computer system 12 that indicates a faulty sensor Sn. User 16 may then choose to use parameter adjustment module 34 to modify the parameters pertaining to sensor Sn to minimize or eliminate codes stemming from sensor Sn until the sensor can be repaired or replaced. Furthermore, computer system 12 can generate a fault code that indicates a blockage in a particular location (e.g., caused by a particular stator armature bar) in response to the pressure increase indicated by sensor S3. Still further, the anomalous increase in temperature and simultaneous decrease in pressure indicated by S1 and S2 can cause generation of a fault code that indicates a leak in a specific seal, causing hot gasses to leak into a liquid area.

While shown and described herein as a method and system for monitoring and diagnosing the operation of a generator, it is understood that aspects of the invention further provide various alternative embodiments. For example, in one embodiment, the invention provides a computer program fixed in at least one computer-readable medium, which when executed, enables a computer system to monitor and diagnose the operation of a generator. To this extent, the computer-readable medium includes program code, such as generator monitoring and diagnostic program 30 (FIG. 1), which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, such as generator monitoring and diagnostic program 30 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for monitoring and diagnosing the operation of a generator. In this case, a computer system, such as computer system 12 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of evaluating generator operation, the method comprising:
   obtaining diagnostic data from a first sensor in a generator, the diagnostic data including a series of data values observed by the first sensor over time;
   evaluating, by a computer system, the diagnostic data to determine whether an anomaly exists as the diagnostic data is obtained using a knowledge base that includes data from parameters that are specific to a type of the generator and data from parameters that are specific to a generator from which the diagnostic data was obtained; and
   based on a determination that the anomaly exists, providing, by the computer system, a fault code that indicates a nature of an error in the generator that caused the anomaly.

2. The method of claim 1, further comprising:
   obtaining diagnostic data from a second sensor in the generator,
   wherein the evaluating determines whether the anomaly exists based on a combination of the diagnostic data from the first and second sensors.

3. The method of claim 2, further comprising:
   prior to the evaluating, changing a default value of one of the parameters used to determine whether the anomaly exists based on a value received from a user via an interface.

4. The method of claim 1, wherein the nature of the error indicated by the fault code is selected from a group, consisting of: an obstruction in a cooling path in the generator, a fluid leak, insulation damage, a short, a stator end winding, a stator wedge looseness, bearing metal damage or seal damage.

5. The method of claim 1, wherein the evaluating includes identifying a source of the anomaly in the generator.

6. A computer system for evaluating generator operation, the computer system comprising:
- a component configured to obtain diagnostic data from a first sensor in a generator, the diagnostic data including a series of data values observed by the first sensor over time;
- a component configured to evaluate the diagnostic data to determine whether an anomaly exists as the diagnostic data is obtained using a knowledge base that includes data from parameters that are specific to a type of the generator and data from parameters that are specific to a generator from which the diagnostic data was obtained;
- a component configured to provide, based on a determination that the anomaly exists, a fault code that indicates a nature of an error in the generator that caused the anomaly.

7. The system of claim 6,
- wherein the component configured to obtain is further configured to retrieve diagnostic data from a second sensor in the generator, and
- wherein the component configured to evaluate determines whether the anomaly exists based on a combination of the diagnostic data from the first and second sensors.

8. The system of claim 6, further comprising:
- a component configured to change a default value of a parameter used to determine whether the anomaly exists based on a value received from a user via an interface,
- wherein the component configured to evaluate determines whether the anomaly exists based on the parameters.

9. The system of claim 6, wherein the nature of the error indicated by the fault code is selected from a group, consisting of: an obstruction in a cooling path in the generator, a fluid leak, insulation damage, a short, a stator end winding, a stator wedge looseness, bearing metal damage or seal damage.

10. The method of claim 6, wherein the component configured to evaluate further identifies a source of the anomaly in the generator.

11. A computer program comprising program code embodied in at least one computer-readable medium, which when executed, enables a computer system to implement a method of evaluating generator operation, the method comprising:
- obtaining diagnostic data from a first sensor in a generator, the diagnostic data including a series of data values observed by the first sensor over time;
- evaluating the diagnostic data to determine whether an anomaly exists as the diagnostic data is obtained using a knowledge base that includes data from parameters that are specific to a type of the generator and data from parameters that are specific to a generator from which the diagnostic data was obtained; and
- based on a determination that the anomaly exists, providing, by the computer system, a fault code that indicates a nature of an error in the generator that caused the anomaly.

12. The computer program of claim 11, the method further comprising:
- obtaining diagnostic data from a second sensor in the generator,
- wherein the evaluating determines whether the anomaly exists based on a combination of the diagnostic data from the first and second sensors.

13. The computer program of claim 11, the method further comprising:
- prior to the evaluating, changing a default value of a parameter used to determine whether the anomaly exists based on a value received from a user via an interface.

14. The computer program of claim 11, wherein the nature of the error indicated by the fault code is selected from a group, consisting of: an obstruction in a cooling path in the generator, a fluid leak, insulation damage, a short, a stator end winding, a stator wedge looseness, bearing metal damage or seal damage.

15. The computer program of claim 11, wherein the evaluating includes identifying a source of the anomaly in the generator.

* * * * *